United States Patent
Chen

(10) Patent No.: US 11,869,570 B2
(45) Date of Patent: Jan. 9, 2024

(54) REFRESH COUNTER CIRCUIT, REFRESH COUNTING METHOD AND SEMICONDUCTOR MEMORY

(71) Applicant: CHANGXIN MEMORY TECHNOLOGIES, INC., Hefei (CN)

(72) Inventor: Jixing Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/669,585

(22) Filed: Feb. 11, 2022

(65) Prior Publication Data

US 2023/0039810 A1 Feb. 9, 2023

Related U.S. Application Data

(63) Continuation of application No. PCT/CN2021/116909, filed on Sep. 7, 2021.

(30) Foreign Application Priority Data

Aug. 9, 2021 (CN) .......................... 202110910368.1

(51) Int. Cl.
*G11C 11/406* (2006.01)
*G11C 11/4093* (2006.01)

(52) U.S. Cl.
CPC .... *G11C 11/40615* (2013.01); *G11C 11/4093* (2013.01); *G11C 11/40618* (2013.01); *G11C 11/40622* (2013.01)

(58) Field of Classification Search
CPC ................................................. G11C 11/40615
See application file for complete search history.

(56) References Cited

U.S. PATENT DOCUMENTS

| | | | | |
|---|---|---|---|---|
| 7,911,867 B2* | 3/2011 | Lee | ................... | G11C 11/40615 |
| | | | | 365/236 |
| 10,170,174 B1* | 1/2019 | Ito | ..................... | G11C 11/40615 |
| 2007/0230264 A1* | 10/2007 | Eto | ........................ | G11C 11/406 |
| | | | | 365/222 |
| 2010/0182862 A1* | 7/2010 | Teramoto | ................. | G11C 7/04 |
| | | | | 365/236 |
| 2018/0342282 A1* | 11/2018 | Morgan | ............ | G11C 11/40603 |
| 2021/0158861 A1* | 5/2021 | Jeong | ................ | G11C 11/40615 |
| 2022/0093165 A1* | 3/2022 | Mitsubori | ......... | G11C 11/40611 |

FOREIGN PATENT DOCUMENTS

CN 207489475 U 6/2018

* cited by examiner

*Primary Examiner* — Min Huang
(74) *Attorney, Agent, or Firm* — Cooper Legal Group, LLC

(57) ABSTRACT

A refresh counter circuit, a refresh counting method and a semiconductor memory are provided. The refresh counter circuit includes: a first signal generator that is configured to generate a first carry signal according to each of refresh pulse signals generated by a received refresh command; a second signal generator that is configured to generate a second carry signal according to a last refresh pulse signal generated by the received refresh command; a first counter that is configured to perform signal inversion according to the first carry signal and generate a first output signal; and a second counter that is configured to count the refresh command according to the second carry signal and generate a second output signal; where the refresh command generates at least two refresh pulse signals.

12 Claims, 5 Drawing Sheets

REFRESH COUNTER CIRCUIT, REFRESH COUNTING METHOD AND SEMICONDUCTOR MEMORY

CROSS-REFERENCE TO RELATED APPLICATION

This application is a continuation of International Patent Application No. PCT/CN2021/116909, filed on Sep. 7, 2021, which is based on and claims priority to Chinese Patent Application No. 202110910368.1, filed on Aug. 9, 2021. The disclosures of International Patent Application No. PCT/CN2021/116909 and Chinese Patent Application No. 202110910368.1 are hereby incorporated by reference in their entireties.

BACKGROUND

With the rapid development of capacity and speed of semiconductor memory devices widely used in electronic devices, power consumption of semiconductor memory devices has been increasing.

A dynamic random access memory (DRAM) is a volatile semiconductor memory device that stores data by using charges stored in a capacitor. Since the charge stored in the capacitor may leak in various ways over time, the DRAM has limited data retention characteristics. In order to solve the limited data retention, the DRAM typically needs to be periodically refreshed according to the data stored in the DRAM to charge or discharge the capacitor.

During the refresh operation, whether the refresh counter may count reliably will directly affect the success or failure of the refresh operation.

SUMMARY

The present disclosure relates to, but is not limited to, a refresh counter circuit, a refresh counting method, and a semiconductor memory.

In a first aspect, the embodiments of the present disclosure provide a refresh counter circuit. The circuit include: a first signal generator configured to generate a first carry signal according to each of the refresh pulse signals generated by a received refresh command; a second signal generator configured to generate a second carry signal according to the last refresh pulse signal generated by the received refresh command; a first counter configured to perform signal inversion according to the first carry signal and generate a first output signal; and a second counter configured to count the refresh command according to the second carry signal and generate a second output signal; wherein the refresh command generates at least two refresh pulse signals.

In a second aspect, the embodiments of the present disclosure provide a refresh counting method. The method includes: receiving a refresh command; where, the refresh command generates at least two refresh pulse signals; generating a first carry signal according to each of the refresh pulse signals generated by the refresh command; performing signal inversion according to the first carry signal, and generating a first output signal; generating a second carry signal according to the last refresh pulse signal generated by the refresh command; and counting the refresh command according to the second carry signal, and generating a second output signal.

In a third aspect, the embodiments of the present disclosure provide a semiconductor memory including the refresh counter circuit according to any one of the first aspect.

BRIEF DESCRIPTION OF THE DRAWINGS

In the drawings, unless otherwise specified, the same reference numerals refer to the same or similar parts or elements throughout a plurality of drawings. The drawings are not necessarily drawn to scale. It is to be understood that these drawings only depict some embodiments disclosed according to the present disclosure, and is not to be regarded as limiting the scope of the present disclosure.

DETAILED DESCRIPTION

Figure 1:
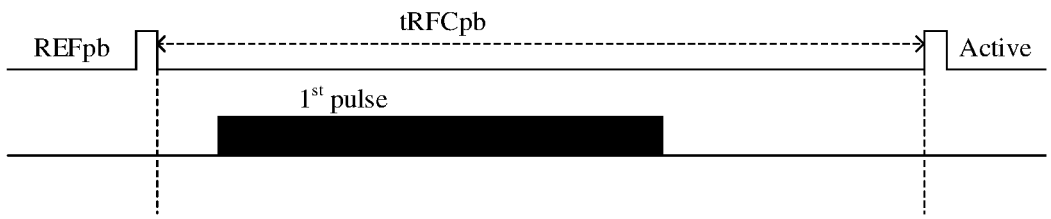
FIG. 1 illustrates a schematic diagram of a one pulse refresh mode.

The exemplary embodiments disclosed in the present disclosure will be described in more detail below with reference to the accompanying drawings. Although exemplary embodiments of the present disclosure are shown in the accompanying drawings, it is to be understood that the present disclosure may be implemented in various forms without being limited by the specific embodiments set forth herein. Rather, these embodiments are provided to enable a more thorough understanding of the present disclosure and to enable the full scope disclosed by the present disclosure to be communicated to those skilled in the art.

In the following description, a number of specific details are given to provide a more thorough understanding of the present disclosure. However, it will be apparent to those skilled in the art that the present disclosure may be implemented without one or more of these details. In other examples, some technical features well-known in the art are not described to avoid confusion with the present disclosure; namely, all features of the actual embodiments are not described herein, and well-known functions and structures are not described in detail.

In addition, the drawings are merely schematic illustrations of the present disclosure and are not necessarily drawn to scale. The same reference numerals in the drawings denote the same or similar parts, and thus repeated descriptions thereof will be omitted. Some of the block diagrams shown in the drawings are functional entities that do not necessarily correspond to physically or logically independent entities. The functional entities may be implemented in software form, or in one or more hardware modules or integrated circuits, or in different network and/or processor devices and/or micro-controller devices.

The flowchart shown in the drawings is illustrative only and does not necessarily include all steps. For example, some of the steps may also be decomposed and some may be merged or partially merged, so the actually executed order may vary depending on the actual situation.

The purpose of the terms used here is merely to describe specific embodiments and not as a limitation of the present disclosure. When used herein, the singular forms of "a", "an" and "the said/the" are also intended to include plural forms, unless the context clearly indicates otherwise. It is also to be understood that the terms "composing" and/or "including", when used in this specification, determine the existence of the described features, integers, steps, operations, elements and/or parts, but do not exclude the existence or addition of one or more other features, integers, steps, operations, elements, parts, and/or groups. As used herein, the term "and/or" includes any and all combinations of related listed items.

Figure 2:
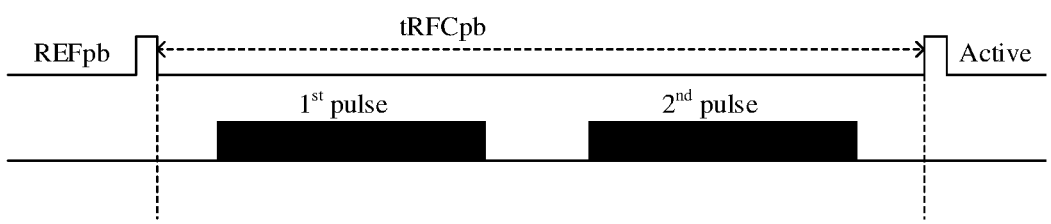
FIG. 2 illustrates a schematic diagram of a two pulse refresh mode.

FIG. 1 illustrates a schematic diagram of a one pulse refresh mode. FIG. 2 illustrates a schematic diagram of a two pulse refresh mode. It should be noted that the one pulse refresh mode generates one refresh pulse signal for each of the refresh commands, and the two pulse refresh mode generates two refresh pulse signals for each of the refresh commands. As illustrated in FIG. 1 and FIG. 2, REFpb is a per bank refresh command, Active is an activation command, tRFCpb cycle should be satisfied between REFpb command and Active command, and tRFCpb is a per bank refresh cycle. It should be noted that there is also a multi pulse refresh mode that generates at least two refresh pulse signals for each of the refresh commands. As illustrated in FIG. 1, each of the refresh commands generates a refresh pulse signal ($1^{st}$ pulse). As illustrated in FIG. 2, each of the refresh commands generates two refresh pulse signals ($1^{st}$ pulse and $2^{nd}$ pulse).

In the embodiments of the present disclosure, one refresh pulse signal corresponds to one refresh operation, that is, one row address is refreshed.

In some embodiments, the refresh command is a refresh command for a given bank. For example, a given bank may include 8 banks, and when all bank refresh operations are performed on the given bank, access to any of the 8 banks in the given bank is not allowed. The waiting time for all bank refresh operations is a constant value. For example, the waiting time for all bank refresh operations may be about 130 nanoseconds (ns). The waiting time may also be measured as a plurality of clock cycles. It should be noted that the semiconductor memory may include any number of banks.

In some embodiments, the waiting of a per bank refresh operation is typically less than the waiting time of all bank refresh operations. In a specific example, the waiting time of a per bank refresh operation may reach 60 ns. However, while one of the eight banks is being refreshed and is not accessible, the other seven banks are accessible. In a particular example, when the memory controller determines that the predicted waiting time for a given bank is less than the waiting time for all bank refresh operations, the memory controller may select to perform a per bank refresh operation.

When the semiconductor memory is refreshed, a refresh counter that counts the refresh address is required inside the semiconductor memory. In particular, in the two pulse refresh mode, each of the refresh commands generates two refresh pulse signals, in other words, two refresh addresses are required for each of the refresh commands Here, the refresh address is the row address of the bank. Since each of the refresh pulse signals corresponds to one refresh address, the count of the refresh address herein may also be understood as a count of the refresh pulse signal.

In the two pulse refresh mode, for all bank refresh commands, since each of the refresh pulse signal will refresh all banks at the same time, every refresh according to one refresh pulse signal, the refresh counter is incremented by one to ensure that all refresh addresses may be refreshed. However, for a per bank refresh command, its refresh pulse signal is only valid for this bank, and the carry condition of the refresh counter is that each of the refresh address is traversed by all banks, so the carry of the refresh counter may not be increased by 1 every refresh according to one refresh pulse signal like all banks refresh. For example, if the start address of the refresh counter is 0000 and three consecutive bank refresh operations are performed, the address of the refresh counter changes to 0000 → 0001 →0002 →0003 →0004 →0005. However, if three per banks are refreshed continuously, the address of the refresh counter changes to 0000 →0001 →0000→0001 → 0000 →0001 . . . , and the refresh counter will not be carried to 0002 until all banks refresh the addresses of 0000 and 0001.

Figure 3:
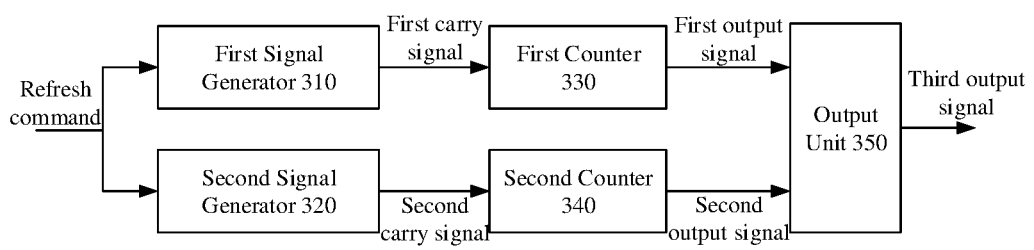
FIG. 3 illustrates a schematic diagram of a refresh counter circuit according to an embodiment of the present disclosure.

The embodiments of the present disclosure provides a refresh counter circuit. FIG. 3 illustrates a schematic diagram of a refresh counter circuit according to an embodiment of the present disclosure. As illustrated in FIG. 3, the circuit includes a first signal generator 310, a second signal generator 320, a first counter 330, and a second counter 340.

A first signal generator 310 is configured to generate a first carry signal according to each of the refresh pulse signals generated by a received refresh command.

A second signal generator 320 is configured to generate a second carry signal according to the last refresh pulse signal generated by the received refresh command.

A first counter 330 is configured to perform signal inversion according to the first carry signal and generate a first output signal.

A second counter 340 is configured to count the refresh command according to the second carry signal and generate a second output signal.

Here, the refresh command generates at least two refresh pulse signals.

In the embodiments of the present disclosure, in the multi pulse refresh mode, since the second counter counts according to the second carry signal, and the second carry signal is generated according to the last refresh pulse signal generated by the received refresh command, then, whether all bank refresh conditions or a per bank refresh condition, the second carry signal occurs only after the refresh command is executed to the last refresh pulse signal, whereby the second counter counts the refresh command. In the embodiments of the present disclosure, the second carry signal generated by the second signal generator may count the refresh command in the multi pulse refresh mode.

In the embodiments of the present disclosure, the circuit further include: an output unit 350 that is configured to output a third output signal according to the first output signal and the second output signal, and the third output signal represents a count of the refresh pulse signal.

In the embodiments of the present disclosure, in the multi pulse refresh mode, the third output signal representing the count of the refresh pulse signal may be obtained according to the second output signal counting the refresh command and the first output signal inverted with each refresh pulse signal, thereby realizing the count of the refresh pulse signal. Since each of the refresh pulse signals corresponds to one refresh address, the refresh address may also be counted.

In the embodiments of the present disclosure, the refresh command is an all bank refresh command or a per bank refresh command; here, the refresh pulse signals generated by the all bank refresh command are used to refresh all banks simultaneously. Here, simultaneous refresh is a simultaneous refresh of the same row address for all banks. The refresh pulse signal generated by the per bank refresh command is used to refresh all banks one by one before repeating the refresh of any bank. Here, refresh one by one is to refresh one row of addresses in one bank of all banks.

It is to be noted that for a per bank refresh command, when performing a per bank refresh operation, all banks should be refreshed with a per bank refresh command before repeating a refresh of any bank. In other words, a per bank refresh operation is a non-repetitive one-by-one refresh operation for all banks. Here, for each of the per bank refresh commands, the refresh order of all banks in the process of refreshing one by one may be adjusted according to actual requirements.

It should also be noted that all banks described in the embodiments of the present disclosure are not all banks in the semiconductor memory but all given banks to which the refresh command is directed. All banks mean all banks in a semiconductor memory only when a given bank for which a refresh command is directed is all banks in the semiconductor memory.

In the embodiments of the present disclosure, the first counter 330 is specifically configured to output a digital high-level signal or a digital low-level signal; here, each time the first counter 330 receives the first carry signal, a signal inversion is performed on a level of a digital high-level signal or a level of a digital low-level signal currently output by the first counter 330 to output the first output signal. In a specific example, the digital high-level signal may be signal 1, and the digital low-level signal may be signal 0. That is, the first counter performs signal inversion between the signal 1 and the signal 0 according to the first carry signal.

Figure 4:
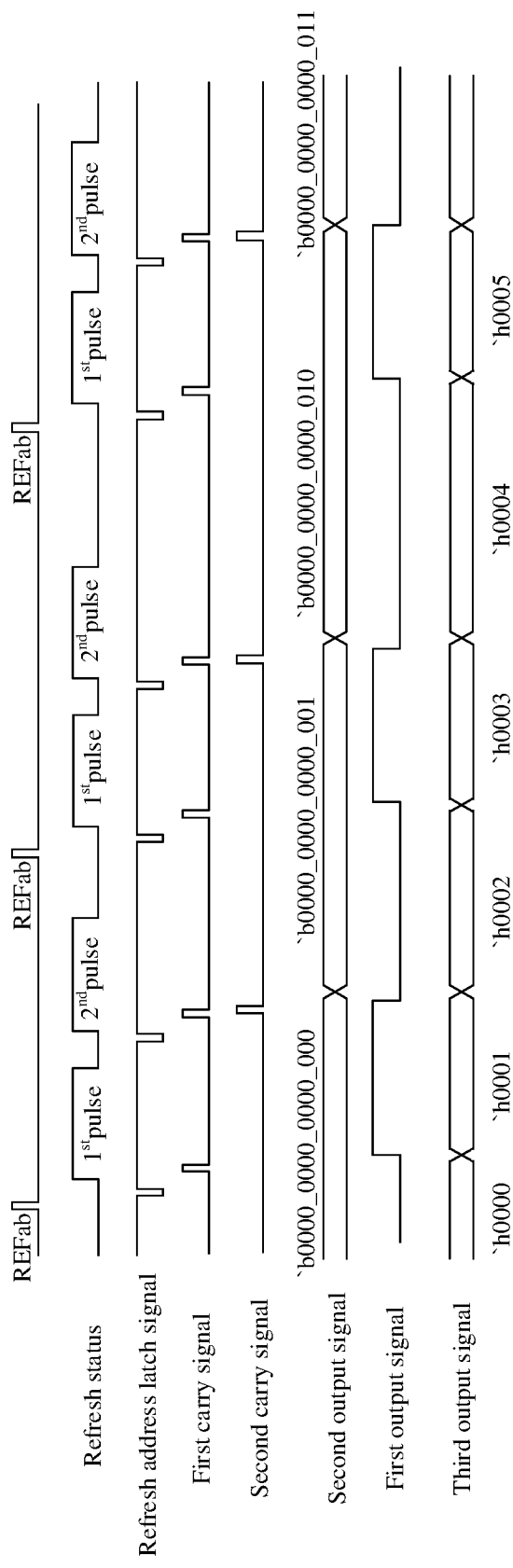
FIG. 4 illustrates a timing diagram of refreshing all banks according to an embodiment of the present disclosure.

FIG. 4 illustrates a timing diagram of refreshing all banks according to an embodiment of the present disclosure. It should be noted that FIG. 4 is an example in which the start address of the refresh is 0000 and all three bank refresh operations are successively executed. As illustrated in FIG. 4, there are three all bank refresh (REFab) commands, and each of the REFab commands generates two refresh pulse signals. The first carry signal is generated according to each of the refresh pulse signals generated by the received refresh command, so that a first carry signal is generated after each of the refresh pulse signals is generated. The second carry signal is generated according to the last refresh pulse signal generated by the received refresh command, so that a second carry signal is generated after each of the REFab commands generating the second refresh pulse signal. The first output signal is generated by the first counter by signal inversion according to the first carry signal, and the first output signal is inverted between the digital high-level signal 1 and the digital low-level signal 0 as the first carry signal is generated. The second output signal is obtained by the second counter by counting the REFab command according to the second carry signal, and after the execution of the first REFab command, the second output signal is b0000_0000_0000_001, that is, the count of the REFab command is one; after executing the second REFab command, the second output signal is 'b0000_0000_0000_010, that is, the count of the REFab command is two; after executing the third REFab command, the second output signal is 'b0000_0000_0000_011, that is, the count of the REFab command is three. A third output signal is obtained according to the first output signal and the second output signal, and represents a count of the refresh pulse signal. Specifically, the first output signal is served as the lowest bit of the third output signal, and the second output signal is served as the second lowest bit to the highest bit of the third output signal. The first output signal, the second output signal, and the third output signal use binary counting. After the first refresh pulse signal of the first REFab command, the third output signal changes from 'b0000_0000_0000_0000 to 'b0000_0000_0000_0001, and the corresponding decimal count changes from 'h0000 to 'h0001, that is, the count of the refresh pulse signal/refresh address is one; after the second refresh pulse signal of the first REFab command, the third output signal changes from 'b0000_0000_0000_0001 to 'b0000_0000_0000_0010, and the corresponding decimal count changes from 'h0001 to 'h0002, that is, the count of the refresh pulse signal/refresh address is two; . . . ; after the second refresh pulse signal of the third REFab command, the third output signal changes from 'b0000_0000_0000_0101 to 'b0000_0000_0000_0110, and the corresponding decimal count changes from 'h0005 to 'h0006, that is, the count of the refresh pulse signal/refresh address is six. In the embodiments of the present disclosure, according to the first output signal and the second output signal, the counting of the refresh pulse signal in the multi pulse refresh mode may be realized. Since each of the refresh pulse signals corresponds to one refresh address, according to the first output signal and the second output signal, the refresh address in the multi pulse refresh mode may be accurately counted in the embodiments of the present disclosure.

In the embodiments of the present disclosure, the second signal generator 320 is specifically configured to generate the second carry signal according to the last refresh pulse signal generated by the refresh command of the last bank; here, with respect to each of the per bank refresh commands, when the bank counter counts to the last bank, the second signal generator 320 generates the second carry signal according to the last refresh pulse signal generated by the per bank refresh command of the last bank. In a specific example, when the refresh command mode is the two pulse refresh mode and the given bank for which the refresh command is directed is eight banks, in the case where a refresh command is a refresh command for all bank, the second signal generator generates a second carry signal according to the second refresh pulse signal generated by the refresh command. In the case where the refresh command is a per bank refresh command, each of the per bank refresh commands needs to traverse all banks, so that for each of the per bank refresh command, if the per bank refresh command refreshes the banks in order from the first bank to the eighth bank, the second signal generator generates the second carry signal according to the second refresh pulse signal generated by the refresh command of the last bank (the eighth bank) executing the refresh command.

In the embodiments of the present disclosure, in the case where the refresh command is a per bank refresh command, the circuit further includes: a bank counter (not illustrated in FIG. 3) that is configured to count a refreshed bank according to the per bank refresh command Since each of the per bank refresh commands needs to traverse all banks, a bank counter is also required to count the banks that perform the per bank refresh command operations.

In the embodiments of the present disclosure, in the case where the refresh command is a per bank refresh command, the third output signal represents a count of refresh times performed on each of the banks.

Figure 5:
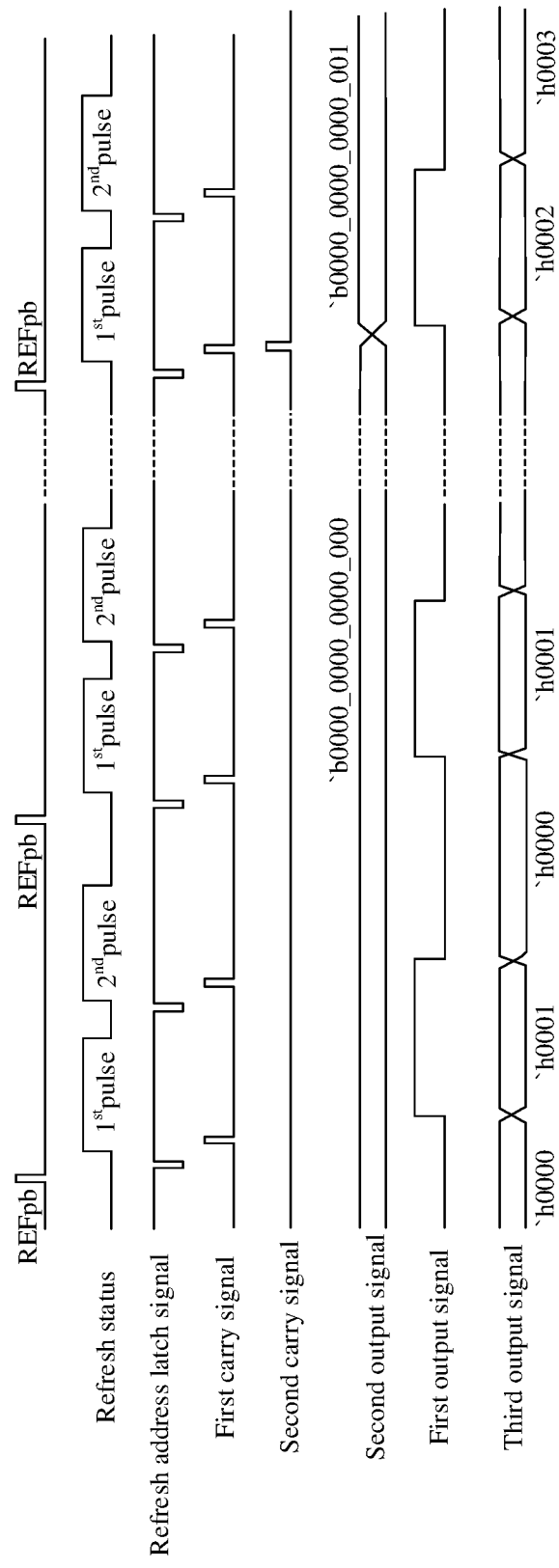
FIG. 5 illustrates a timing diagram of refreshing a per bank according to an embodiment of the present disclosure.

FIG. 5 illustrates a timing diagram of refreshing a per bank according to an embodiment of the present disclosure. It should be noted that FIG. 5 is an example in which the start address of the refresh is 0000 and three per bank refresh operations are successively executed. As illustrated in FIG.

5, since each of the per bank refresh (REFpb) commands needs to traverse all banks one by one, only part of the REFpb commands are illustrated in FIG. 5, and each of the REFpb commands generates two refresh pulse signals. Here, the command corresponding to the first per bank refresh operation executed by the bank is referred to as a first REFpb command; the command corresponding to the second per bank refresh operation executed by the bank is referred to as a second REFpb command; the command corresponding to the third per bank refresh operation performed by the bank is referred to as a third REFpb command. The first carry signal is generated according to each of the refresh pulse signals generated by the received refresh command, so that a first carry signal is generated after each of the refresh pulse signals is generated. The second carry signal is generated according to the last refresh pulse signal generated by the received refresh command, so that for each of the REFpb commands, a second carry signal is generated only after the second refresh pulse signal is generated by the REFpb command of the last bank, in this way, the second counter counts only after the second refresh pulse signal is generated by the REFpb command of the last bank. The first output signal is generated by the first counter by signal inversion according to the first carry signal, and the first output signal is inverted between the digital high-level signal 1 and the digital low-level signal 0 as the first carry signal is generated. The second output signal is obtained by the second counter by counting the REFpb command according to the second carry signal. For the first group of REFpb commands, after the second refresh pulse signal is generated in the last REFab command of the first group of REFab commands, the second output signal is 'b0000_0000_0000_001, that is, the count of the REFpb command is one; similarly, for the second group of REFpb commands, after the last REFab command in the second group of REFab commands generates the second refresh pulse signal, the second output signal is 'b0000_0000_0000_010, that is, the count of REFpb commands is two; for the third group of REFpb commands, after the last in the third group of REFab commands generates the second refresh pulse signal, the second output signal is 'b0000_0000_0000_011, that is, the count of the REFpb commands is three. Here, the first group of REFpb commands is a set of first REFpb commands corresponding to all banks; the second group of REFpb commands is a set of second REFpb commands corresponding to all banks; the third group of REFpb commands is a set of third REFpb commands corresponding to all banks. A third output signal is obtained according to the first output signal and the second output signal, represents a count of the refresh pulse signal. Specifically, the first output signal is served as the lowest bit of the third output signal, and the second output signal is served as the second lowest bit to the highest bit of the third output signal. The first output signal, the second output signal, and the third output signal use binary counting. It should be noted that the third output signal described below is expressed using decimal counting for the sake of brevity of the description due to excessive changes in the third output signal.

For the first group of REFpb commands, the third output signal changes to 'h0000→'h0001→'h0000→'h0001→'h0000→'h0001 . . . , the third output signal changes from 'h0001 to 'h0002 until the second refresh pulse signal is generated by the last first REFpb command in the first group of REFpb commands, that is, the count of the refresh pulse signal/refresh address is two; the count of refresh pulse signal in the second group of REFpb commands is entered; for the second group of REFpb commands, the third output signal changes to 'h0002→'h0003→'h0002→'h0003→'h0002→'h0003 . . . , the third output signal changes from 'h0003 to 'h0004 until the second refresh pulse signal is generated by the last second REFpb command in the second group of REFpb commands, that is, the count of the refresh pulse signal/refresh address is four; the count of refresh pulse signal in the third group of REFpb commands is entered; for the third group of REFpb commands, the third output signal changes to 'h0004→'h0005→'h0004→'h0005→'h0004→'h0005 . . . , the third output signal changes from 'h0005 to 'h0006 until the second refresh pulse signal is generated by the last third REFpb command in the third group of REFpb commands, that is, the count of the refresh pulse signal/refresh address is six. In the embodiments of the present disclosure, according to the first output signal and the second output signal, the counting of the refresh pulse signal in the multi pulse refresh mode may be realized. Since each of the refresh pulse signals corresponds to one refresh address, according to the first output signal and the second output signal, the refresh address in the multi pulse refresh mode may be accurately counted in the embodiments of the present disclosure.

In the embodiments of the present disclosure, the first counter 330 includes a flip-flop and a plurality of inverters; an output Q port of the flip-flop is connected to an input terminal of an inverter, and an output terminal of the inverter is connected to an input D port of the flip-flop; a clock CLK port of the flip-flop is connected to an output terminal of the first signal generator to receive the first carry signal; an output Q port of the flip-flop is connected to an input terminal of the output unit, and outputs the first output signal to the output unit. In some embodiments, the above flip-flop may be a D flip-flop and the inverter may be a logic NAND gate.

Figure 6:
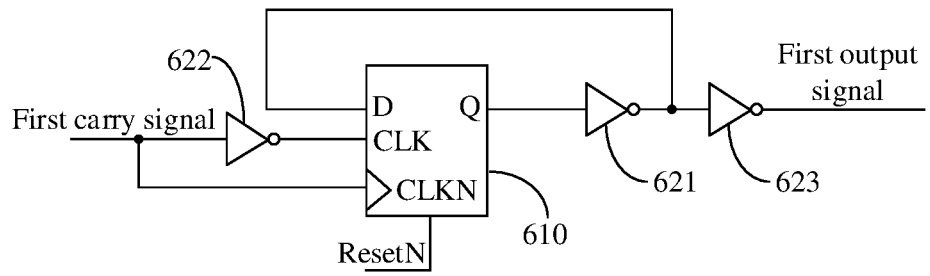
FIG. 6 illustrates a schematic diagram of a first counter according to a specific example of the present disclosure.

FIG. 6 illustrates a schematic diagram of a first counter according to a specific example of the present disclosure. As illustrated in FIG. 6, the first counter includes:

A first flip-flop 610 and three inverters (621-623); the output Q port of the first flip-flop 610 is connected to the input terminal of a first inverter 621, and the output terminal of the first inverter 621 is connected to the input D port of the first flip-flop 610; the clock CLK port of the first flip-flop 610 is connected to the output terminal of the first signal generator by a second inverter 622, the first flip-flop 610 receives a first carry signal output from the first signal generator by the second inverter 622, the clock CLK port is logically complementary to the inverted clock CLKN port, and therefore, the inverted clock CLKn port of the first flip-flop 610 does not need to be connected to the output terminal of the first signal generator by the inverter; the output Q port of the first flip-flop 610 is connected to the input terminal of the output unit by the first inverter 621 and a third inverter 623, and outputs the first output signal to the output unit by the first inverter 621 and the third inverter 623. Here, after the first output signal passes through the two inverters, neither the phase of the first output signal nor the count value characterized by the first output signal changes, but the driving capability of the first output signal is enhanced. In other words, in the embodiments of the present disclosure, the purpose of providing two inverters between the output Q port of the first flip-flop and the input terminal of the output unit is to enhance the driving capability of the first output signal without changing the phase of the first output signal and the count value characterized by the first output signal.

In the embodiments of the present disclosure, the second counter includes a plurality of flip-flops and a plurality of inverters; an output Q port of a flip-flop for a lower bit is connected to a clock CLK port of a flip-flop for a bit which is higher than the lower bit by one; an output Q port of each of the flip-flops is connected to an input terminal of an inverter, the output terminal of which is connected to an input D port of the flip-flop; a clock CLK port of the lowest bit flip-flop is connected to an output terminal of the second signal generator to receive the second carry signal; an output Q port of each of the flip-flops is connected to an input terminal of the output unit, and outputs the second output signal to the output unit. In some embodiments, the above flip-flop may be a D flip-flop and the inverter may be a logic NAND gate.

Figure 7:
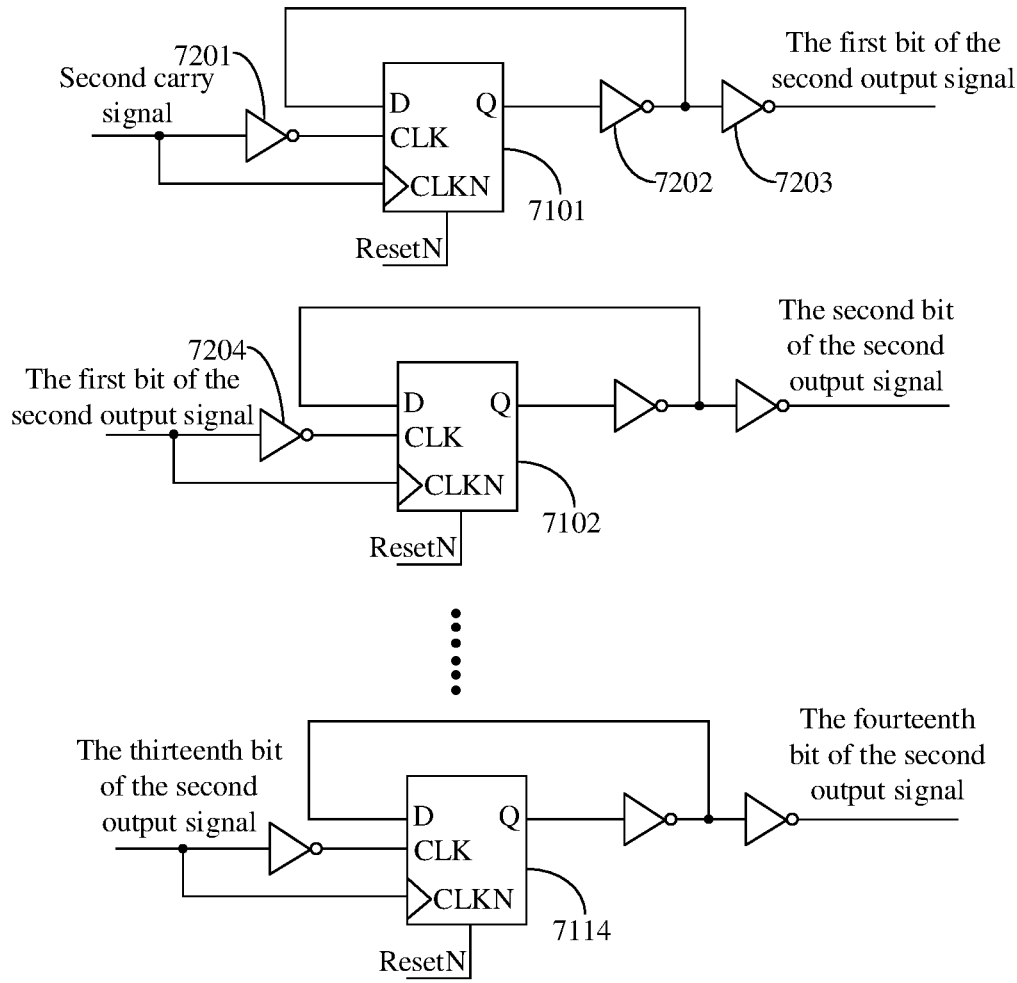
FIG. 7 illustrates a schematic diagram of a second counter according to a specific example of the present disclosure.

FIG. 7 illustrates a schematic diagram of a second counter according to a specific example of the present disclosure. It should be noted that FIG. 7 illustrates an example in which the second counter includes 14 flip-flops and 42 inverters, and only 3 flip-flops and 9 inverters are illustrated in FIG. 7. As illustrated in FIG. 7, the second counter includes:

Fourteen flip-flops (7101-7114) and forty-two inverters (7201-7242). The clock CLK port of a second flip-flop 7101 (lowest bit flip-flop) is connected to the output terminal of the second signal generator by a fifth inverter 7201 by which the second flip-flop 7101 receives a second carry signal output by the second signal generator; the output Q port of the second flip-flop 7101 and the clock CLK port of the third flip-flop 7102 are connected with each other by three inverters (the sixth inverter 7202, the seventh inverter 7203, and the eighth inverter 7204, respectively), the clock CLK port is logically complementary to the inverted clock CLKN port, so that the output Q port of the second flip-flop 7101 and the inverted clock CLKn port of the third flip-flop 7102 need only be connected by two inverters (the sixth inverter 7202 and the seventh inverter 7203, respectively); by analogy, the output Q port of the flip-flop for the lower bit is connected to the clock CLK port of the upper bit flip-flop. The output Q port of each of the flip-flops and the input D port of the flip-flop is connected with each other by an inverter; an output Q port of each of the flip-flops is connected to an input terminal of the output unit by two inverters, and a second output signal output by each of the flip-flop output Q port is output to the output unit by the two inverters. Here, the fourth flip-flop 7114 is the highest bit flip-flop. The second flip-flop 7101 outputs a first bit of the second output signal from the Q port (the lowest bit of the second output signal), the third flip-flop 7102 outputs a second bit of the second output signal from the Q port, . . . , and the fourth flip-flop 7114 outputs a fourteenth bit of the second output signal from the Q port (the highest bit of the second output signal). A second output signal consisting of a first bit of the second output signal to a fourteenth bit of the second output signal is input to the output unit.

In the embodiments of the present disclosure, in the multi pulse refresh mode, since the second counter is counted according to the second carry signal, and the second carry signal is generated according to the last refresh pulse signal generated by the received refresh command, then, whether an all bank refresh condition or a per bank refresh condition, the second carry signal occurs only after the refresh command is executed to the last refresh pulse signal, whereby the second counter counts the refresh command. In the embodiments of the present disclosure, the refresh command in the multi-pulse refresh mode may be counted by the second carry signal generated by the second signal generator.

Furthermore, according to the second output signal counting the refresh command and the first output signal inverting the signal with each of the refresh pulse signals, a third output signal representing the counting of the refresh pulse signal may be obtained, thereby realizing the counting of the refresh pulse signal. Since each of the refresh pulse signals corresponds to one refresh address, the refresh address may also be counted.

Figure 8:
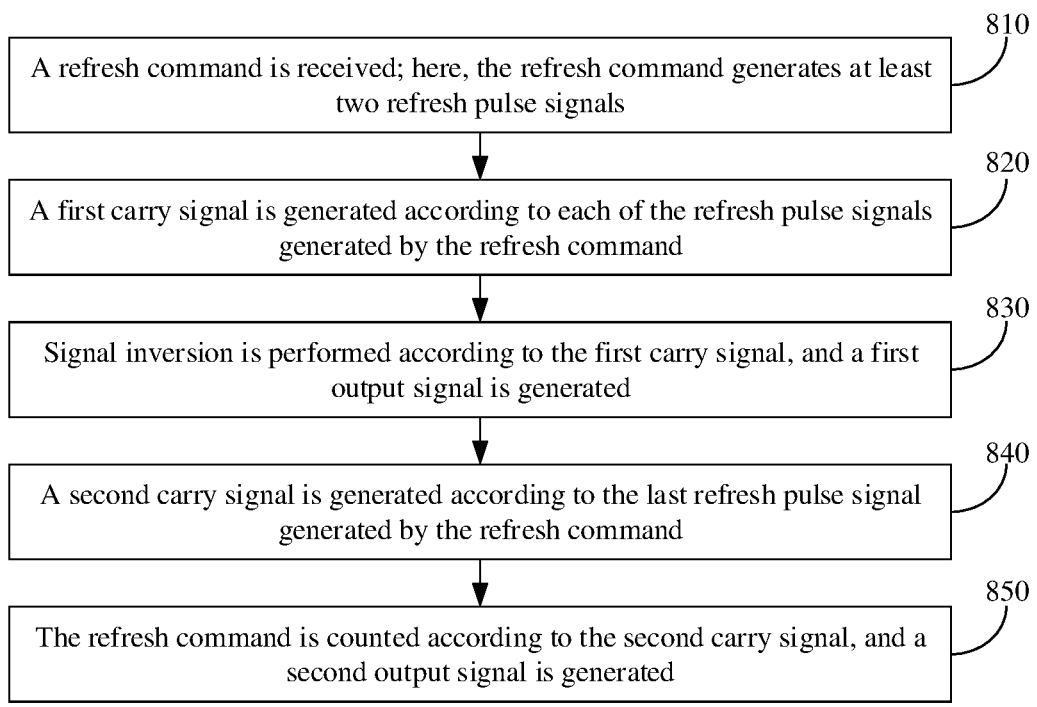
FIG. 8 illustrates a schematic flowchart of implementing a refresh counting method according to an embodiment of the present disclosure.

According to the same technical concept as the above refresh counter circuit, the embodiments of the present disclosure provides a refresh counting method. FIG. 8 illustrates a schematic flowchart of implementing a refresh counting method according to an embodiment of the present disclosure. As illustrated in FIG. 8, the method mainly includes the following steps.

In S810, a refresh command is received; here, the refresh command generates at least two refresh pulse signals.

In S820, a first carry signal is generated according to each of the refresh pulse signals generated by the refresh command.

In S830, signal inversion is performed according to the first carry signal, and a first output signal is generated.

In S840, a second carry signal is generated according to the last refresh pulse signal generated by the refresh command.

In S850, the refresh command is counted according to the second carry signal, and a second output signal is generated.

In the embodiments of the present disclosure, after S850, the method further includes: outputting a third output signal according to the first output signal and the second output signal, the third output signal represents a count of the refresh pulse signal.

In the embodiments of the present disclosure, the refresh command is an all bank refresh command or a per bank refresh command; here, the refresh pulse signal generated by the all bank refresh command is used to refresh all banks simultaneously; the refresh pulse signal generated by the per bank refresh command is used to refresh all banks one by one before repeating the refresh of any bank.

In the embodiments of the present disclosure, in the case where the refresh command is a per bank refresh command, the method further includes: counting the refreshed bank according to the per bank refresh command.

In the embodiments of the present disclosure, S840 includes: generating the second carry signal according to the last refresh pulse signal generated by the per bank refresh command of the last bank with respect to each of the per bank refresh commands, when the bank counter counts to the last bank.

In the embodiments of the present disclosure, in the case where the refresh command is a per bank refresh command, the third output signal represents a count of refresh times performed on each of the banks.

In the embodiments of the present disclosure, S830 includes: performing signal inversion on the level of the currently output digital high-level signal or digital low-level signal, each time the first carry signal is received, to generate the first output signal.

It is to be noted that the description of the above refresh counting method is similar to the above description of embodiments of the refresh counter circuit, and has similar advantageous effects as the embodiments of the refresh counter circuit, so it is not described again. For technical details not disclosed in the refresh counting method in the embodiments of the present disclosure, please refer to the description of the refresh counter circuit in the embodiments of the present disclosure.

The embodiments of the present disclosure further provides a semiconductor memory including the above refresh counter circuit. The semiconductor memory referred to by the present disclosure includes but is not limited to a dynamic random access memory and the like. The semiconductor memory may use the refresh counter circuit in the present disclosure to implement counting of refresh commands, refresh pulse signals, and refresh addresses in the multi pulse refresh mode.

In some embodiments, the semiconductor memory is a dynamic random access memory DRAM chip whose memory conforms to the DDR2 memory specification.

In some embodiments, the semiconductor memory is a dynamic random access memory DRAM chip whose memory conforms to the DDR3 memory specification.

In some embodiments, the semiconductor memory is a dynamic random access memory DRAM chip whose memory conforms to the DDR4 memory specification.

In some embodiments, the semiconductor memory is a dynamic random access memory DRAM chip whose memory conforms to the DDR5 memory specification.

The methods disclosed in the several method embodiments provided in the present disclosure may be arbitrarily combined without conflict to obtain new method embodiments.

The features disclosed in the several device embodiments provided by the present disclosure may be arbitrarily combined without conflict to obtain new device embodiments.

The above descriptions are merely specific implementations of the present disclosure, but the protection scope of the present disclosure is not limited thereto. Any change or replacement readily conceived by those skilled in the art within the technical scope disclosed in the present disclosure shall fall within the protection scope of the present disclosure. Therefore, the protection scope of the present disclosure shall be subject to the protection scope of the claims.

The invention claimed is:

1. A refresh counter circuit, comprising:
   a first signal generator, configured to generate a first carry signal according to each of refresh pulse signals generated by a received refresh command;
   a second signal generator, configured to generate a second carry signal according to a last refresh pulse signal generated by the received refresh command;
   a first counter, configured to perform signal inversion according to the first carry signal and generate a first output signal;
   a second counter, configured to count the received refresh command according to the second carry signal and generate a second output signal; and
   an output unit, configured to output a third output signal according to the first output signal and the second output signal, the third output signal representing a count of the refresh pulse signals;
   wherein the received refresh command generates at least two refresh pulse signals,
   the received refresh command is an all bank refresh command or a per bank refresh command,
   each of the refresh pulse signals generated by the all bank refresh command is used to refresh all banks simultaneously;
   each of the refresh pulse signals generated by the per bank refresh command is used to refresh all banks one by one before repeating refresh of any bank; and
   the second signal generator is specifically configured to generate the second carry signal according to a last refresh pulse signal generated by the received refresh command of a last bank; wherein for each of the per bank refresh commands, when a bank counter counts to the last bank, the second signal generator generates the second carry signal according to the last refresh pulse signal generated by the per bank refresh command of the last bank.

2. The refresh counter circuit of claim 1, wherein in the case where the received refresh command is the per bank refresh command, the refresh counter circuit further comprises:
   the bank counter, configured to count a refreshed bank according to the per bank refresh command.

3. The refresh counter circuit of claim 1, wherein in the case where the received refresh command is the per bank refresh command, the third output signal represents a count of refresh times performed on each of the banks.

4. The refresh counter circuit of claim 1, wherein
   the first counter is specifically configured to output a digital high-level signal or a digital low-level signal; wherein each time the first counter receives the first carry signal, a signal inversion is performed on a level of a digital high-level signal or a level of a digital low-level signal currently output by the first counter to output the first output signal.

5. The refresh counter circuit of claim 1, wherein
   the first counter comprises a flip-flop and a plurality of inverters; an output Q port of the flip-flop is connected to an input terminal of an inverter, and an output terminal of the inverter is connected to an input D port of the flip-flop; a clock CLK port of the flip-flop is connected to an output terminal of the first signal generator to receive the first carry signal; an output Q port of the flip-flop is connected to an input terminal of the output unit, and outputs the first output signal to the output unit.

6. The refresh counter circuit of claim 1, wherein
   the second counter comprises a plurality of flip-flops and a plurality of inverters; an output Q port of a flip-flop for a lower bit is connected to a clock CLK port of a flip-flop for a bit which is higher than the lower bit by one; an output Q port of each of the flip-flops is connected to an input terminal of an inverter, an output terminal of which is connected to an input D port of the flip-flop; a clock CLK port of a lowest bit flip-flop is connected to an output terminal of the second signal generator to receive the second carry signal; the output Q port of each of the flip-flops is connected to an input terminal of the output unit, and outputs the second output signal to the output unit.

7. A refresh counting method, comprising:
   receiving a refresh command; wherein the refresh command generates at least two refresh pulse signals;
   generating a first carry signal according to each of the refresh pulse signals generated by the refresh command;
   performing signal inversion according to the first carry signal, and generating a first output signal;
   generating a second carry signal according to a last refresh pulse signal generated by the refresh command;
   counting the refresh command according to the second carry signal, and generating a second output signal; and
   outputting a third output signal according to the first output signal and the second output signal, the third output signal representing a count of the refresh pulse signals;
   wherein the refresh command is an all bank refresh command or a per bank refresh command;

each of the refresh pulse signals generated by the all bank refresh command is used to refresh all banks simultaneously;

each of the refresh pulse signals generated by the per bank refresh command is used to refresh all banks one by one before repeating refresh of any bank; and the counting the refresh command according to the second carry signal comprises:

for each of the per bank refresh commands, when a bank counter counts to a last bank, generating the second carry signal according to a last refresh pulse signal generated by the per bank refresh command of the last bank.

8. The refresh counting method of claim 7, wherein in the case where the refresh command is the per bank refresh command, the method further comprises:

counting a refreshed bank according to the per bank refresh command.

9. The refresh counting method of claim 7, wherein in the case where the refresh command is the per bank refresh command, the third output signal represents a count of refresh times performed on each of the banks.

10. The refresh counting method of claim 7, wherein performing signal inversion according to the first carry signal comprises:

performing signal inversion on level of currently output digital high-level signal or digital low-level signal, each time the first carry signal is received.

11. A semiconductor memory comprising a refresh counter circuit, wherein the refresh counter circuit comprises:

a first signal generator, configured to generate a first carry signal according to each of refresh pulse signals generated by a received refresh command;

a second signal generator, configured to generate a second carry signal according to a last refresh pulse signal generated by the received refresh command;

a first counter, configured to perform signal inversion according to the first carry signal and generate a first output signal;

a second counter, configured to count the received refresh command according to the second carry signal and generate a second output signal; and an output unit, configured to output a third output signal according to the first output signal and the second output signal, the third output signal representing a count of the refresh pulse signals;

wherein the received refresh command generates at least two refresh pulse signals;

the received refresh command is an all bank refresh command or a per bank refresh command, each of the refresh pulse signals generated by the all bank refresh command is used to refresh all banks simultaneously;

each of the refresh pulse signals generated by the per bank refresh command is used to refresh all banks one by one before repeating refresh of any bank; and the second signal generator is specifically configured to generate the second carry signal according to a last refresh pulse signal generated by the received refresh command of a last bank; wherein for each of the per bank refresh commands, when a bank counter counts to the last bank, the second signal generator generates the second carry signal according to the last refresh pulse signal generated by the per bank refresh command of the last bank.

12. The semiconductor memory of claim 11, wherein the semiconductor memory is a dynamic random access memory (DRAM) chip.

* * * * *